(12) United States Patent
Puente et al.

(10) Patent No.: US 9,935,677 B2
(45) Date of Patent: Apr. 3, 2018

(54) DEVICES AND METHODS RELATED TO HIGH POWER DIODE SWITCHES WITH LOW DC POWER CONSUMPTION

(71) Applicant: SKYWORKS SOLUTIONS, INC., Woburn, MA (US)

(72) Inventors: Richard Mark Puente, Westminster, MA (US); Stephen Richard Moreschi, Peabody, MA (US); Shuping Zhang, Andover, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/198,125

(22) Filed: Jun. 30, 2016

(65) Prior Publication Data

US 2017/0005693 A1     Jan. 5, 2017

Related U.S. Application Data

(60) Provisional application No. 62/186,852, filed on Jun. 30, 2015.

(51) Int. Cl.

| | |
|---|---|
| *H04B 1/44* | (2006.01) |
| *H04M 1/00* | (2006.01) |
| *H01L 29/868* | (2006.01) |
| *H01L 23/66* | (2006.01) |
| *H01L 23/367* | (2006.01) |
| *H01L 23/373* | (2006.01) |
| *H01L 23/495* | (2006.01) |
| *H01L 23/498* | (2006.01) |

(52) U.S. Cl.

CPC ........... *H04B 1/44* (2013.01); *H01L 23/3677* (2013.01); *H01L 23/3735* (2013.01); *H01L 23/49506* (2013.01); *H01L 23/66* (2013.01); *H01L 29/868* (2013.01); *H01L 23/49541* (2013.01); *H01L 23/49562* (2013.01); *H01L 23/49575* (2013.01); *H01L 23/49827* (2013.01); *H01L 2223/6677* (2013.01); *H01L 2224/48091* (2013.01); *H01L 2924/181* (2013.01)

(58) Field of Classification Search

CPC ........................................................ H04B 1/44
USPC ...................................................... 455/83, 78
See application file for complete search history.

(56) References Cited

U.S. PATENT DOCUMENTS

| | | | |
|---|---|---|---|
| 5,877,726 A | 3/1999 | Kudoh et al. | |
| 5,911,116 A * | 6/1999 | Nosswitz ................. | H04B 1/48 455/82 |

(Continued)

*Primary Examiner* — Tilahun B Gesesse
(74) *Attorney, Agent, or Firm* — Chang & Hale LLP

(57) ABSTRACT

Devices and methods are disclosed, related to high power diode switches. In some embodiments, a radio-frequency switch circuit can include a first switchable path implemented between a pole and a first throw, the first switchable path including one or more PIN diodes, and a second switchable path implemented between the pole and a second throw, the second switchable path including one or more PIN diodes. The radio-frequency switch circuit can further include a switchable shunt path implemented between the second throw and a ground, the switchable shunt path including at least one shunt PIN diode and a capacitance between the second throw and the at least one shunt PIN diode. The pole can be an antenna port, and the first and second throws can be transmit and receive ports, respectively.

18 Claims, 11 Drawing Sheets

(56) References Cited

U.S. PATENT DOCUMENTS

| | | | |
|---|---|---|---|
| 6,218,911 B1* | 4/2001 | Kong | H01H 59/0009 200/181 |
| 6,356,536 B1* | 3/2002 | Repke | H04B 1/48 370/282 |
| 9,112,504 B2 | 8/2015 | Sameshima et al. | |
| 2004/0203550 A1* | 10/2004 | Xu | H04B 1/48 455/277.1 |
| 2005/0270745 A1 | 12/2005 | Chen et al. | |
| 2006/0141943 A1 | 6/2006 | De Graauw | |
| 2008/0030285 A1* | 2/2008 | Gurov | H01P 1/15 333/104 |
| 2008/0088388 A1* | 4/2008 | Kormanyos | H01P 1/185 333/103 |
| 2008/0305749 A1 | 12/2008 | Ben-Bassat | |
| 2010/0156511 A1* | 6/2010 | Botula | H01L 27/1203 327/535 |
| 2011/0163792 A1 | 7/2011 | Ando | |
| 2012/0236464 A1 | 9/2012 | Hertel et al. | |
| 2013/0049730 A1 | 2/2013 | Kato | |
| 2015/0303977 A1* | 10/2015 | Puente | H01P 1/213 455/78 |

\* cited by examiner

RFC TO RF1 STATE

RFC TO RF2 STATE

TRANSMIT STATE

RECEIVE STATE

DEVICES AND METHODS RELATED TO HIGH POWER DIODE SWITCHES WITH LOW DC POWER CONSUMPTION

CROSS-REFERENCE TO RELATED APPLICATION(S)

This application claims priority to U.S. Provisional Application No. 62/186,852 filed Jun. 30, 2015, entitled DEVICES AND METHODS RELATED TO HIGH POWER DIODE SWITCHES WITH LOW DC POWER CONSUMPTION, the disclosure of which is hereby expressly incorporated by reference herein in its entirety.

BACKGROUND

Field

The present disclosure relates to diode switches for radio-frequency (RF) applications.

Description of the Related Art

In some radio-frequency (RF) applications, signals can be routed between an antenna and a transceiver through, for example, one or more transmit paths and one or more receive paths. Such routing of signals can be facilitated by switches.

SUMMARY

In accordance with some implementations, the present disclosure relates to a radio-frequency (RF) switch circuit that includes a first switchable path implemented between a pole and a first throw, the first switchable path including one or more PIN diodes, a second switchable path implemented between the pole and a second throw, the second switchable path including one or more PIN diodes, and a switchable shunt path implemented between the second throw and a ground, the switchable shunt path including at least one shunt PIN diode and a capacitance between the second throw and the at least one shunt PIN diode.

In some embodiments, the pole is an antenna port. In some embodiments, the first throw is a transmit port configured to receive an amplified radio-frequency signal. In some embodiments, the radio-frequency switch circuit further comprises an additional switchable shunt path implemented between the transmit port and a ground.

In some embodiments, the additional switchable shunt path includes at least one shunt PIN diode. In some embodiments, the radio-frequency switch circuit further comprises a transmit bias port electrically connected to a node between the first throw and the one or more PIN diodes of the first switchable path.

In some embodiments, the second throw is a receive port configured to output a received signal. In some embodiments, the radio-frequency switch circuit further comprises a receive bias port electrically connected to a node between the second throw and the one or more PIN diodes of the second switchable path. In some embodiments, the radio-frequency switch circuit further comprises a receive shunt bias port electrically connected to a node between the capacitance and the at least one shunt PIN diode of the switchable shunt path.

A method is disclosed, for operating a radio-frequency switch circuit in a transmit mode. In some embodiments, the method comprises activating a first switchable path including one or more PIN diodes implemented between an antenna port and a transmit port, by applying a forward bias to the one or more PIN diodes of the first switchable path.

The method further comprises deactivating a second switchable path including one or more PIN diodes implemented between the antenna port and a receive port, by applying a reverse bias to the one or more PIN diodes of the second switchable path, and activating a switchable shunt path implemented between the receive port and a ground, and including at least one shunt PIN diode and a capacitance between the receive port and the at least one shunt PIN diode, by applying a forward bias to the at least one shunt PIN diode of the switchable shunt path.

In some embodiments, applying the forward bias to the one or more PIN diodes includes applying a forward bias voltage to a transmit bias port electrically connected to a node between the transmit port and the one or more PIN diodes of the first switchable path. In some embodiments, applying the reverse bias to the one or more PIN diodes includes applying a reverse bias voltage to a receive bias port electrically connected to a node between the receive port and the one or more PIN diodes of the second switchable path.

In some embodiments, applying a forward bias to the at least one shunt PIN diode includes applying a forward bias voltage to a receive shunt bias port electrically connected to a node between the capacitance and the at least one shunt PIN diode of the switchable shunt path.

According to some teachings, the present disclosure relates to an antenna switch module (ASM) that includes a grounding pad and an electrical insulator layer implemented over the grounding pad. The ASM further includes a switch circuit having a first switchable path implemented between an antenna port and a transmit port, the first switchable path including one or more PIN diodes implemented over the electrical insulator layer. The switch circuit further includes a second switchable path implemented between the antenna port and a receive port, the second switchable path including one or more PIN diodes implemented over the electrical insulator layer. The switch circuit further includes a switchable shunt path implemented between the receive port and a ground, the switchable shunt path including at least one shunt PIN diode implemented over the electrical insulator layer and a capacitance between the receive port and the at least one shunt PIN diode implemented over the electrical insulator layer.

In some embodiments, the electrical insulator layer is a thermal conductor thereby allowing conduction of heat between a PIN diode and the grounding pad. In some embodiments, the electrical insulator layer includes aluminum nitride (AlN).

In some embodiments, each PIN diode is secured to the electrical insulator layer by a thermally conductive adhesive. In some embodiments, the electrical insulator layer is secured to the grounding pad by a thermally conductive adhesive. In some embodiments, the antenna switch module further includes an overmold implemented over the electrical insulator layer, with the overmold being dimensioned to encapsulate at least the PIN diodes of the switch circuit.

In some implementations, the present disclosure relates to a method for fabricating a radio-frequency (RF) module. The method includes providing or forming an electrical insulator layer. The method further includes forming a switch circuit including a first switchable path implemented between a pole and a first throw, the first switchable path including one or more PIN diodes implemented over the electrical insulator layer. The method further includes forming the switch circuit to further include a second switchable path implemented between the pole and a second throw, the second switchable path including one or more PIN diodes implemented over the electrical insulator layer, the switch circuit further including a first switchable shunt path implemented between the second throw and a ground, the switchable shunt path including at least one shunt PIN diode implemented over the electrical insulator layer and a capacitance between the second throw and the at least one shunt PIN diode implemented over the electrical insulator layer. The method further includes forming a grounding pad under the electrical insulator layer such that the grounding pad is electrically insulated from each of the PIN diodes of the switch circuit.

In a number of implementations, the present disclosure relates to a radio-frequency system that includes an antenna, a transceiver in communication with the antenna, and a transmit/receive switch implemented between the antenna and the transceiver. The transmit/receive switch includes a grounding pad and an electrical insulator layer implemented over the grounding pad. The transmit/receive switch further includes a switch circuit having a first switchable path implemented between an antenna port and a transmit port, the first switchable path including one or more PIN diodes implemented over the electrical insulator layer. The switch circuit further includes a second switchable path implemented between the antenna port and a receive port, the second switchable path including one or more PIN diodes implemented over the electrical insulator layer. The switch circuit further includes a switchable shunt path implemented between the receive port and a ground, the switchable shunt path including at least one shunt PIN diode implemented over the electrical insulator layer and a capacitance between the receive port and the at least one shunt PIN diode implemented over the electrical insulator layer.

In some embodiments, the radio-frequency system is implemented as a base station. In some embodiments, the first switchable path is configured to handle high power associated with amplified transmit signals associated with the base station.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

PIN diodes are utilized in some radio-frequency (RF) applications, such as applications involving high power RF signals. For example, a PIN diode can be utilized as a fast switch to provide switching functionality in RF applications involving high power signals. Described herein are various examples of devices and methods related to RF switches that utilize PIN diodes. Although various examples are described herein in the context of PIN diodes, it will be understood that one or more features of the present disclosure can also be implemented in applications involving other types of diodes. Similarly, although various examples are described herein in the context of RF switches, it will be understood that one or more features of the present disclosure can also be implemented in other types of applications, including non-switching RF applications.

In broad-bandwidth, high-power RF switching applications, PIN diodes can be connected in a series or series/shunt configuration between one or more input ports and one or more output ports. When implemented as such, it is desirable or required to have the cathode contact of a PIN diode be electrically isolated from the ground, and at the same time, have very low thermal impedance to ground to conduct heat out of the switch.

In switches having high RF isolation performance, shunt diodes may also be employed. For systems which only have positive control voltage or current available, one terminal of a shunt diode typically needs to be AC-coupled to a system ground, and reduced or minimized thermal impedance for such a coupling path is typically desirable.

For the purpose of description, PIN diodes, shunt diodes, or simply diodes can be implemented as, for example, silicon-based devices. Other semiconductor process technologies can also be utilized in the PIN diodes/shunt diodes/diodes as described herein.

Described herein various examples of switching devices having desirable features such as low thermal impedance, high RF isolation, and/or low insertion loss. Various switching topologies can be implemented in packaging configurations as described herein to benefit from one or more of the foregoing features, and non-limiting examples of such switching topologies are described in reference to FIGS. 1-8.

Figure 1:
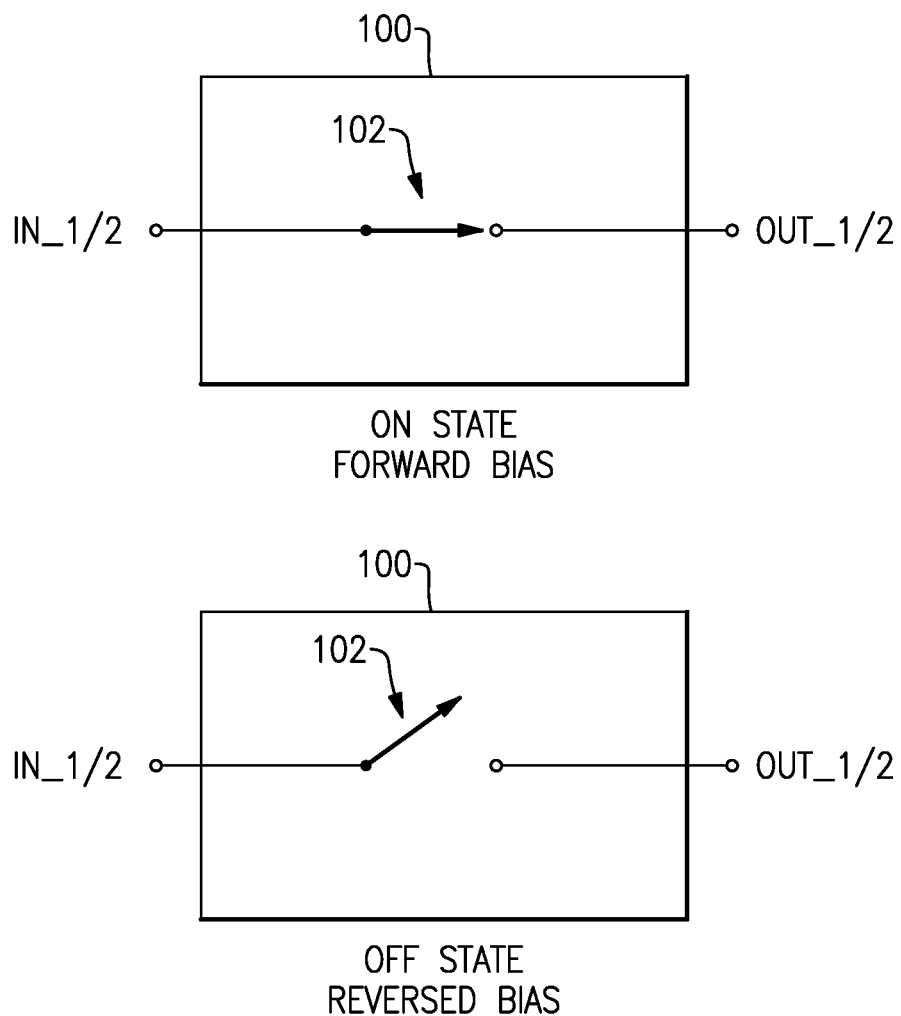
FIG. 1 shows an example topology of a radio-frequency (RF) switch circuit having one or more input ports and one or more output ports.

FIG. 1 shows an example symmetrical topology of an RF switch circuit 100 having one or more input ports (e.g., IN_1 or IN_2) and one or more output ports (e.g., OUT_1 or OUT_2). A switch 102 can be electrically connected between the input port and the output port along an RF path. In an ON state (e.g., achieved by providing a forward bias), the switch 102 is depicted as being closed, thereby completing the RF path between the input port and the output port. In an OFF state (e.g., achieved by providing a reverse bias), the switch 102 is depicted as being open, thereby breaking the RF path between the input port and the output port.

Figure 2:
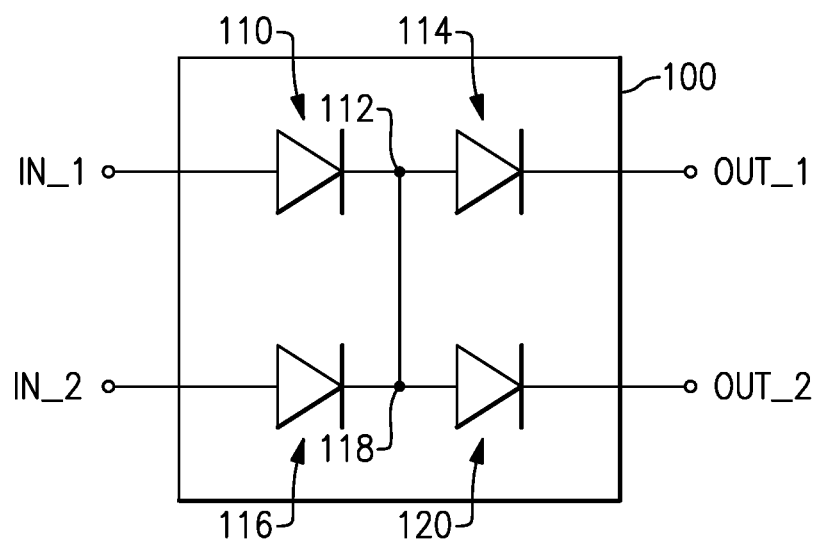
FIG. 2 shows an example RF switch circuit that includes a plurality of PIN diodes that can be configured to provide the functionality of the switch of FIG. 1.

FIG. 2 shows an example RF switch circuit 100 that includes a plurality of PIN diodes that can be configured to provide the functionality of the switch 102 of FIG. 1. In the example of FIG. 2, there are two input ports (IN_1, IN_2) and two output ports (OUT_1, OUT_2); however, it will be understood that other numbers of input port(s) and output port(s) can be utilized.

In FIG. 2, a path between IN_1 and OUT_1 can be formed through a first PIN diode 110, a node 112, and a second PIN diode 114. Similarly, a path between IN_2 and OUT_2 can be formed through a third PIN diode 116, a node 118, and a fourth PIN diode 120. If a path between IN_1 and OUT_2 is desired, such a path can be formed through the first PIN diode 110, the nodes 112, 118, and the fourth PIN diode 120. Similarly, if a path between IN_2 and OUT_1 is desired, such a path can be formed through the third PIN diode 116, the nodes 118, 112, and the second PIN diode 120. Table 1 lists states of the four PIN diodes that can be implemented to achieve the foregoing example paths. For the purpose of description of FIG. 2 and Table 1, it will be assumed that a forward bias on a PIN diode corresponds to an ON state, and a reverse bias corresponds to an OFF state.

TABLE 1

| Input port | Output port | PIN diode 110 | PIN diode 114 | PIN diode 116 | PIN diode 120 |
|---|---|---|---|---|---|
| IN_1 | OUT_1 | ON | ON | OFF | OFF |
| IN_2 | OUT_2 | OFF | OFF | ON | ON |
| IN_1 | OUT_2 | ON | OFF | OFF | ON |
| IN_2 | OUT_1 | OFF | ON | ON | OFF |

Figure 3:
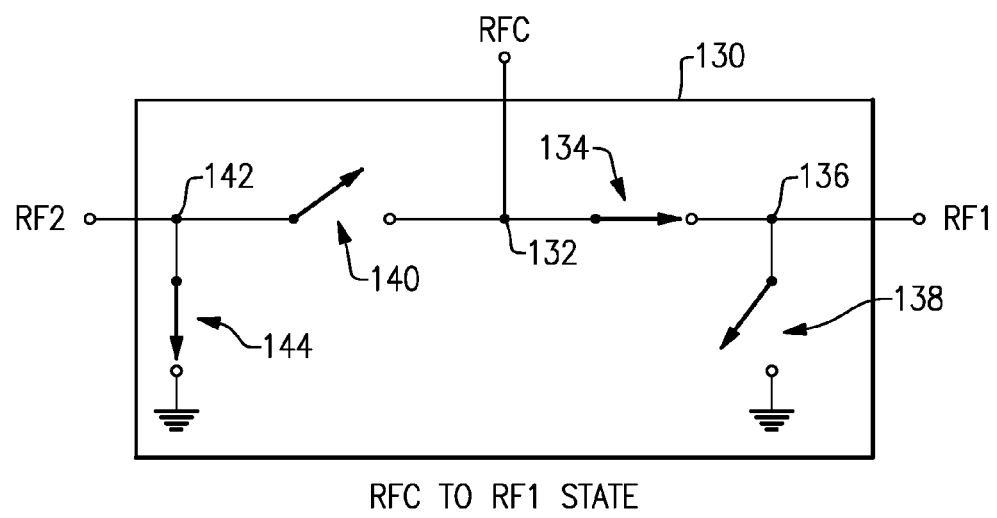
FIG. 3 shows an example topology of an RF switch circuit having a common port and a plurality of RF ports.
Figure 3:
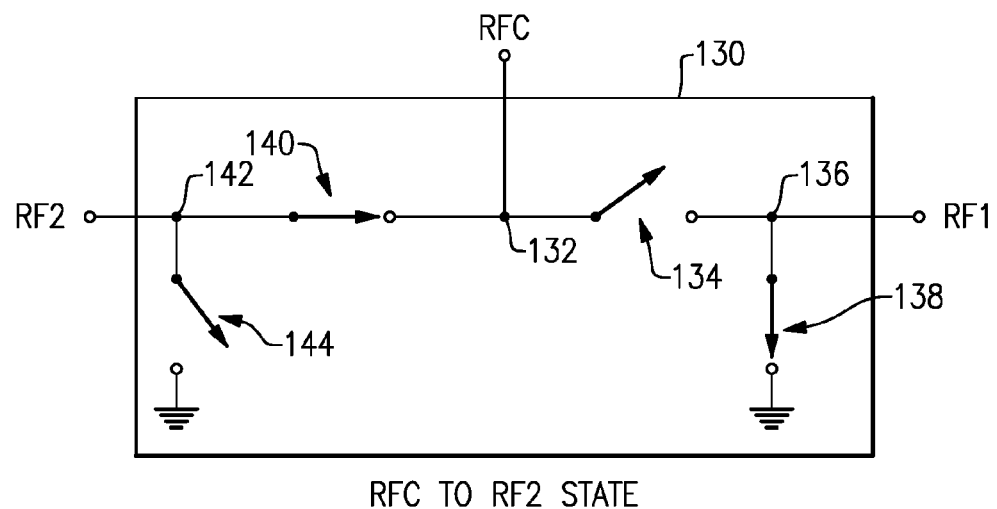

FIG. 3 shows an example topology of an RF switch circuit 130 having a common port RFC and a plurality of RF ports (e.g., RF1 and RF2). Such a topology can be implemented as a single-pole-double-throw (SPDT) with symmetrical switching paths (RF1 and RF2 as the two throws) from a single common port (RFC as the single pole).

A signal path between RFC and RF1 can be achieved with a switch 134 being closed (ON), a shunt switch 138 (between node 136 and ground) being open (OFF), a switch 140 being open (OFF), and a shunt switch 144 (between node 142 and ground) being closed (ON). Similarly, a signal path between RFC and RF2 can be achieved with the switch 140 being closed (ON), the shunt switch 144 (between node 142 and ground) being open (OFF), the switch 134 being open (OFF), and the shunt switch 138 (between node 136 and ground) being closed (ON). In the example of FIG. 3, the shunt path between node 136 and ground can provide improved isolation for the port RF1 (with the switch 138 closed) when the path between RFC and RF1 is open. Similarly, the shunt path between node 142 and ground can provide improved isolation for the port RF2 (with the switch 144 closed) when the path between RFC and RF2 is open.

Figure 4:
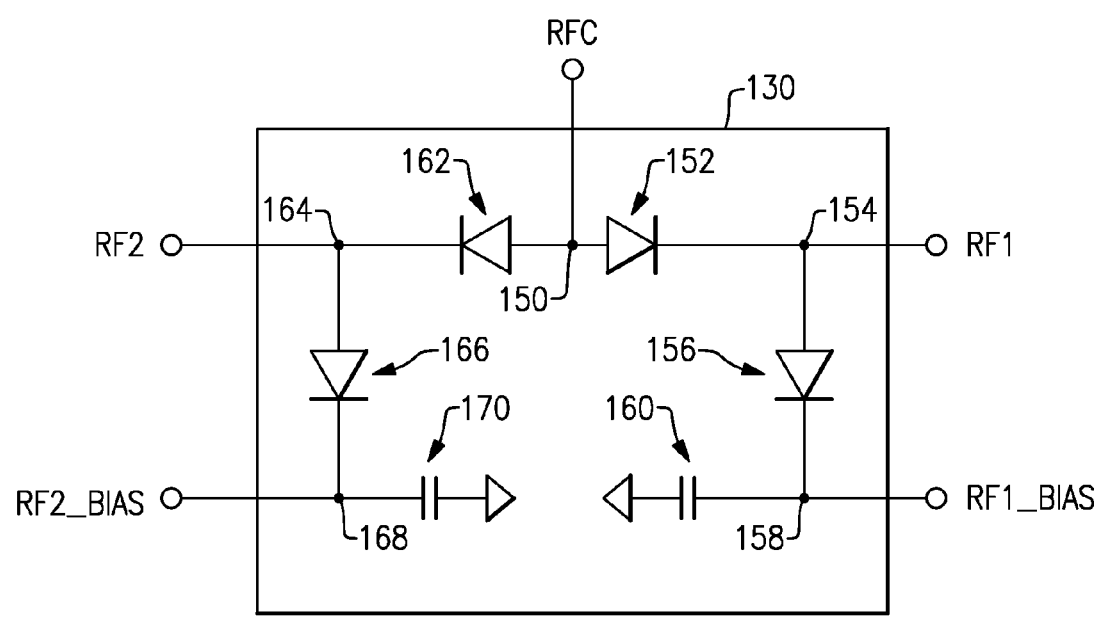
FIG. 4 shows an example RF switch circuit that includes a plurality of PIN diodes that can be configured to provide the functionality of the switches associated with the switching topology of FIG. 3.

FIG. 4 shows an example RF switch circuit 130 that includes a plurality of PIN diodes that can be configured to provide the functionality of the switches associated with the switching topology of FIG. 3. In the example of FIG. 4, a first bias port (RF1_BIAS) for the first shunt diode switch can be provided. Similarly, a second bias port (RF2_BIAS) for the second shunt diode switch can be provided.

In FIG. 4, a first path between RFC and RF1 can be formed through a first PIN diode 152 and node 154. A shunt path for the foregoing first path can be provided between node 154 and ground through a second PIN diode 156, node 158, and a capacitance 160. Similarly, a second path between RFC and RF2 can be formed through a third PIN diode 162 and node 164. A shunt path for the foregoing second path can be provided between node 164 and ground through a fourth PIN diode 166, node 168, and a capacitance 170. Table 2 lists states of the four PIN diodes that can be implemented to achieve the foregoing example paths. For the purpose of description of FIG. 4 and Table 2, it will be assumed that a forward bias on a PIN diode corresponds to an ON state, and a reverse bias corresponds to an OFF state.

TABLE 2

| Active path | PIN diode 152 | PIN diode 156 | PIN diode 162 | PIN diode 166 |
|---|---|---|---|---|
| Between RFC and RF1 | ON | OFF | OFF | ON |
| Between RFC and RF2 | OFF | ON | ON | OFF |

Figure 5:
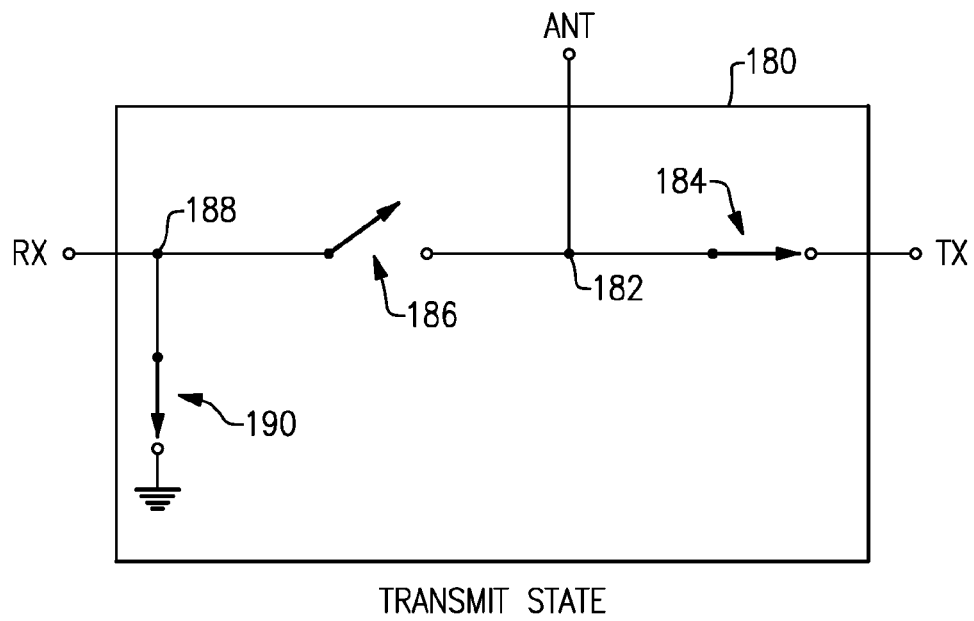
FIG. 5 shows an example topology of an RF switch circuit having a common antenna port ANT, a transmit port TX, and a receive port RX.
Figure 5:
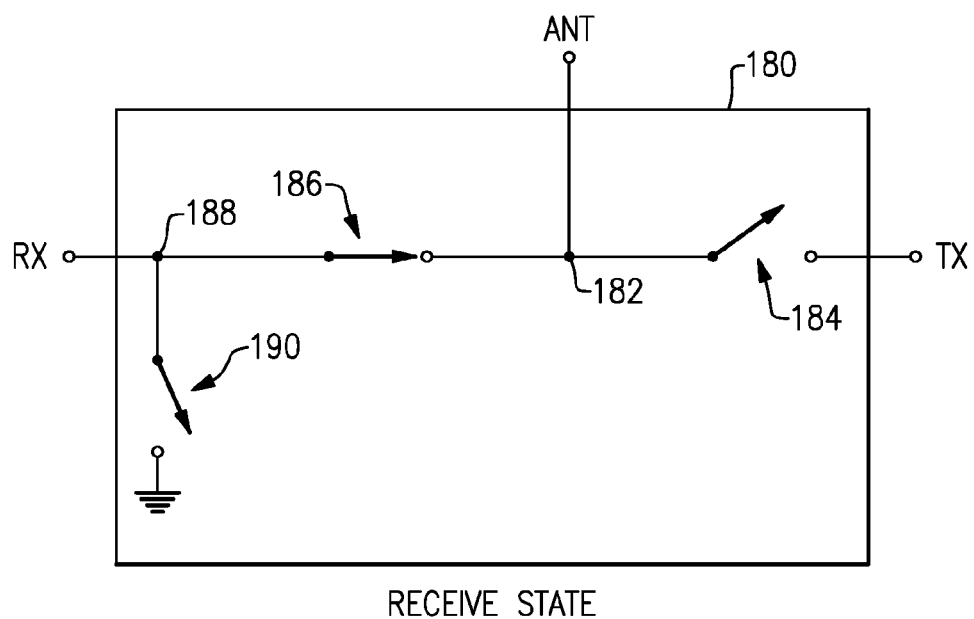

FIG. 5 shows an example asymmetrical topology of an RF switch circuit 180 having a common antenna port ANT, a transmit port TX, and a receive port RX. Such a topology can be implemented as a single-pole-double-throw (SPDT) with transmit and receive switching paths (TX and RX as the two throws) from a single common antenna port (ANT as the single pole).

In a transmit state, a signal path between ANT and TX can be achieved with a switch 184 being closed (ON), a switch 186 being open (OFF), and a shunt switch 190 (between node 188 and ground) being closed (ON). In a receive state, a signal path between ANT and RX can be achieved with the switch 184 being open (OFF), the switch 186 being closed (ON), and the shunt switch 190 (between node 188 and ground) being open (OFF). In the example of FIG. 5, the shunt path between node 188 and ground can provide improved isolation for the receive port RX (with the switch 190 closed) when the transmission path between TX and ANT is active.

Figure 6:
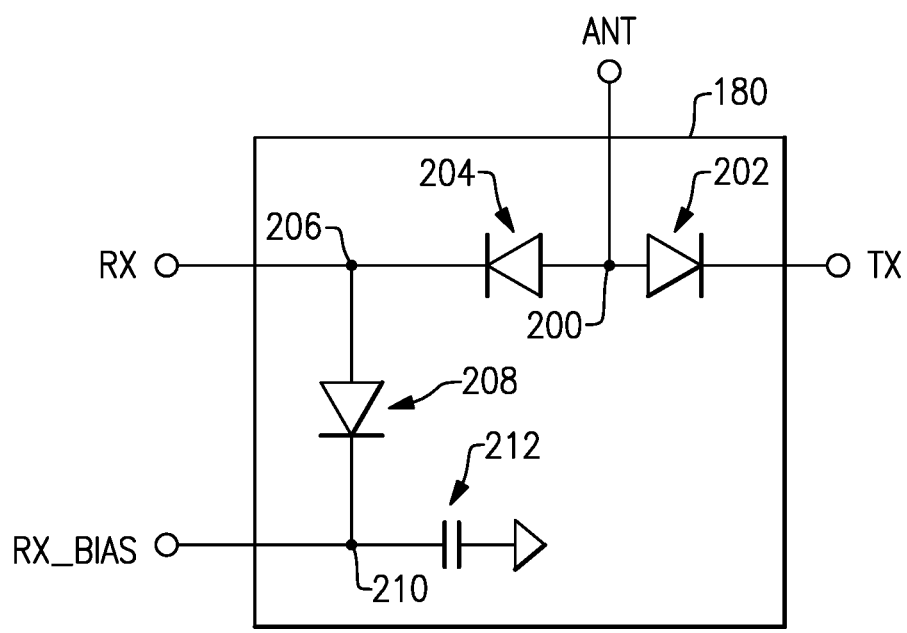
FIG. 6 shows an example RF switch circuit that includes a plurality of PIN diodes that can be configured to provide the functionality of the switches associated with the switching topology of FIG. 5.

FIG. 6 shows an example RF switch circuit 180 that includes a plurality of PIN diodes that can be configured to provide the functionality of the switches associated with the switching topology of FIG. 5. In the example of FIG. 6, a receive bias port (RX_BIAS) for the receive shunt diode switch can be provided.

In FIG. 6, a transmit path between TX and ANT can be formed through a first PIN diode 202 and node 200. A shunt path for the foregoing transmit path may or may not exist. A receive path between ANT and RX can be formed through node 200, a second PIN diode 204, and node 206. A shunt path for the foregoing receive path can be provided between node 206 and ground through a third PIN diode 208, node 210, and a capacitance 212. Table 3 lists states of the three PIN diodes that can be implemented to achieve the foregoing example paths. For the purpose of description of FIG. 6 and Table 3, it will be assumed that a forward bias on a PIN diode corresponds to an ON state, and a reverse bias corresponds to an OFF state.

TABLE 3

| Active path | PIN diode 202 | PIN diode 204 | PIN diode 208 |
|---|---|---|---|
| Between TX and ANT | ON | OFF | ON |
| Between ANT and RX | OFF | ON | OFF |

Figure 7:
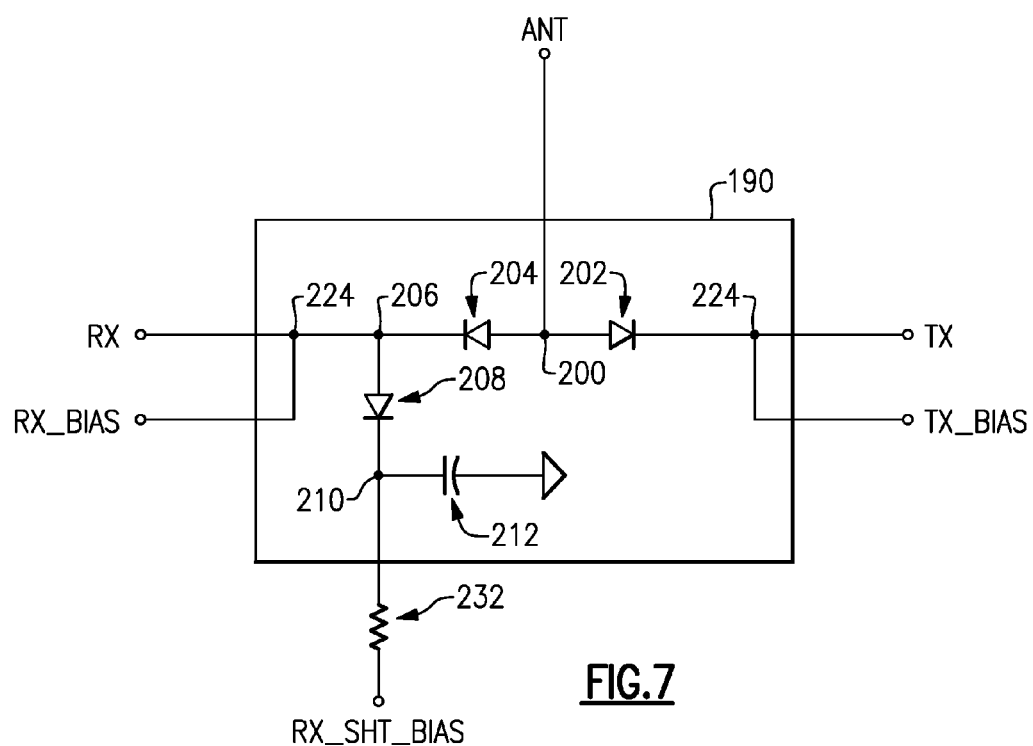
FIG. 7 shows another example RF switch circuit that includes a plurality of PIN diodes that can be configured to provide the functionality of the switches associated with the switching topology of FIG. 5.

FIG. 7 shows an example RF switch circuit 190 that includes a plurality of PIN diodes that can be configured to provide the functionality of the switches associated with the switching topology of FIG. 5 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, in the example of FIG. 7, a receive bias port (RX_BIAS) for the receive diode switch, a receive shunt bias port (RX_SHT_BIAS) for the receive shunt diode switch, and a transmit bias port (TX_BIAS) for the transmit diode switch can be provided.

In FIG. 7, a transmit path between TX and ANT can be formed through node 224, a first PIN diode 202, and node 200. A shunt path for the foregoing transmit path may or may not exist. A receive path between ANT and RX can be formed through node 200, a second PIN diode 204, node 206, and node 224. A shunt path for the foregoing receive path can be provided between node 206 and ground through a third PIN diode 208, node 210, and a capacitance 212. Table 4 lists states of the three PIN diodes that can be implemented to achieve the foregoing example paths. For the purpose of description of FIG. 7 and Table 4, it will be assumed that a forward bias on a PIN diode corresponds to an ON state, and a reverse bias corresponds to an OFF state.

TABLE 4

| Active path | PIN diode 202 | PIN diode 204 | PIN diode 208 |
|---|---|---|---|
| Between TX and ANT | ON | OFF | ON |
| Between ANT and RX | OFF | ON | OFF |

According to some embodiments, when RF switch circuit 190 is in ANT-TX mode (e.g., when the transmit path between TX and ANT is active), a reverse bias (e.g., >28 V) from the RX_BIAS port is applied to second PIN diode 204 in order to restrict second PIN diode 204 from self-rectification due to the high RF power levels present at the ANT port. According to some embodiments, when RF switch circuit 190 is in ANT-TX mode, the same voltage that provides the reverse bias to second PIN diode 204 is also the forward bias for third PIN diode 208 such that RF energy passes through third PIN diode 208 to the ground in order to isolate the RX port. In some embodiments, the majority of this voltage is dropped across resistance 232. For example, the typical forward current level through resistance 232 is 30 mA. As such, in this example, resistance 232 handles approximately 810 mW of DC power.

Figure 8:
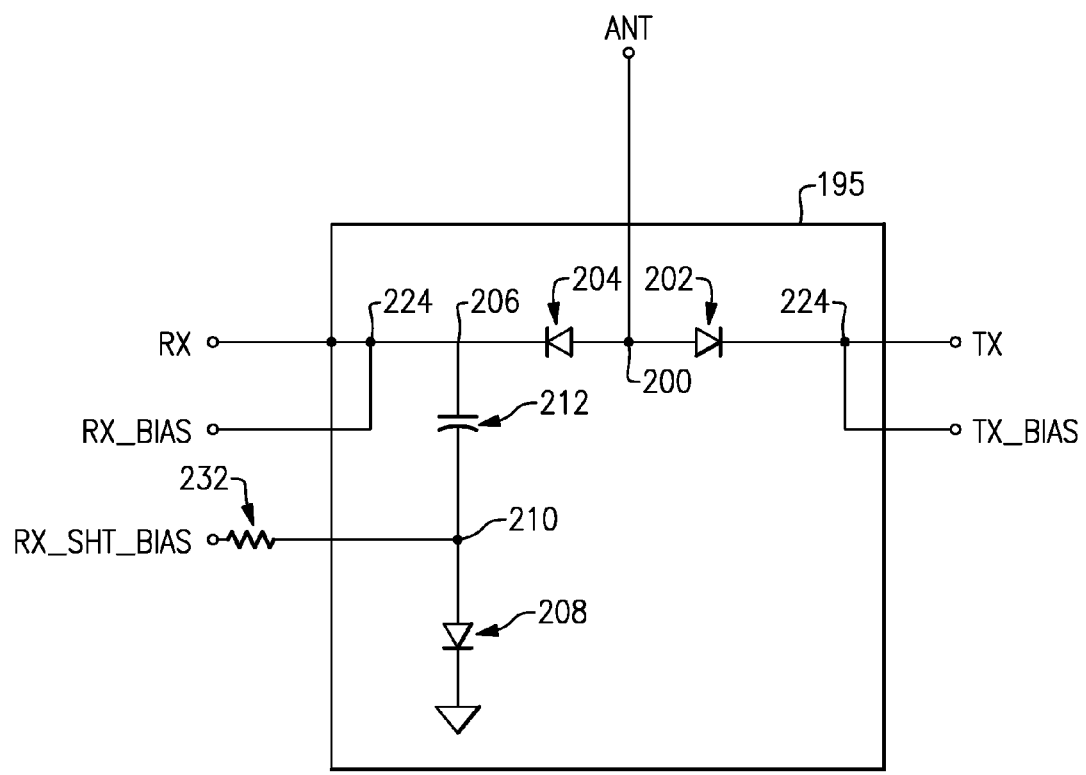
FIG. 8 shows another example RF switch circuit that includes a plurality of PIN diodes that can be configured to provide the functionality of the switches associated with the switching topology of FIG. 5.

FIG. 8 shows an example RF switch circuit 195 that includes a plurality of PIN diodes that can be configured to provide the functionality of the switches associated with the switching topology of FIG. 5 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, in the example of FIG. 8, a receive bias port (RX_BIAS) for the receive diode switch, a receive shunt bias port (RX_SHT_BIAS) for the receive shunt diode switch, and a transmit bias port (TX_BIAS) for the transmit diode switch can be provided.

In FIG. 8, a transmit path between TX and ANT can be formed through node 224, a first PIN diode 202, and node 200. A shunt path for the foregoing transmit path may or may not exist. A receive path between ANT and RX can be formed through node 200, a second PIN diode 204, node 206, and node 224. A shunt path for the foregoing receive path can be provided between node 206 and ground through capacitance 212, node 210, and a third PIN diode 208. Table 5 lists states of the three PIN diodes that can be implemented to achieve the foregoing example paths. For the purpose of description of FIG. 8 and Table 5, it will be assumed that a forward bias on a PIN diode corresponds to an ON state, and a reverse bias corresponds to an OFF state.

TABLE 5

| Active path | PIN diode 202 | PIN diode 204 | PIN diode 208 |
|---|---|---|---|
| Between TX and ANT | ON | OFF | ON |
| Between ANT and RX | OFF | ON | OFF |

According to some embodiments, when RF switch circuit 195 is in ANT-TX mode (e.g., when the transmit path between TX and ANT is active), a reverse bias (e.g., >28 V) from the RX_BIAS port is applied to second PIN diode 204 in order to restrict second PIN diode 204 from self-rectification due to the high RF power levels present at the ANT port. According to some embodiments, when RF switch circuit 195 is in ANT-TX mode, capacitance 212 allows RF energy to pass through third PIN diode 208 to the ground in order to isolate the RX port. Moreover, capacitance 212 also blocks the reverse bias voltage from the RX_BIAS port. As such, when RF switch circuit 195 is in ANT-TX mode, a separate lower forward bias voltage (e.g., 5 V) is applied to third PIN diode 208 from the RX_SHT_BIAS port.

For example, when RF switch circuit 195 is in ANT-TX mode, the typical forward current level through resistance 232 is 20 mA. As such, in this example, resistance 232 handles approximately 120 mW of DC power.

Figure 9:
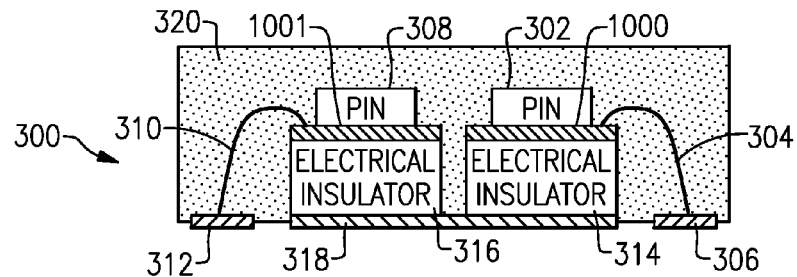
FIG. 9 shows an example module in which a plurality of PIN diodes can be mounted on their respective electrical insulator structures.
Figure 10:
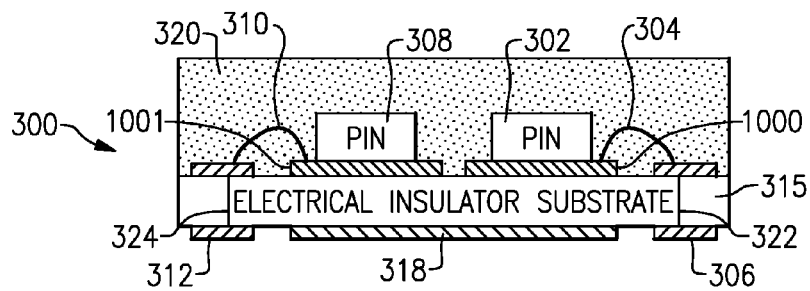
FIG. 10 shows an example module in which a plurality of PIN diodes can be mounted on a common electrical insulator substrate.

FIGS. 9 and 10 show examples of packaged modules 300 having PIN diode based switching circuits as described herein. In some switching applications, it is desirable to have an electrode (e.g., cathode) of a PIN diode be electrically isolated from ground and at the same time be implemented in a packaged module to allow effective removal of heat from the PIN diode. To address such design features, a PIN diode can be mounted on an electrical insulator having a low thermal impedance. The electrical insulator can be in physical contact (directly or through an intermediate layer) with a grounding pad, such that the PIN diode remains electrically isolated from the grounding pad. If the electrical insulator is thermally conductive, heat generated by the PIN diode can be transferred to the grounding pad through the electrical insulator.

In the example module 300 of FIG. 9, a plurality of PIN diodes are shown to be mounted on their respective electrical insulator structures. For example, a first PIN diode 302 is mounted to a metal pattern 1000 on the top of a first electrical insulator structure 314; and a second PIN diode 308 is mounted to a metal pattern 1001 on the top of a second electrical insulator structure 316. An electrode of the first PIN diode 302 attached to metal pattern 1000 is shown to be electrically connected to a first contact pad 306 through a wirebond 304, and an electrode of the second PIN diode 308 attached to metal pattern 1001 is electrically connected to a second contact pad 312 through a wirebond 310. The first contact pad 306 can be a TX port of, for example, the RF switch circuit 195 of FIG. 8, and the second contact pad 312 can be an RX port of the RF switch circuit 195. In such a configuration, the first PIN diode 302 can be, for example, PIN diode 202 in FIG. 8, and the second PIN diode 308 can be PIN diode 204 of FIG. 8. Although not shown in FIG. 9, an ANT port and RX_SHT_BIAS port can be implemented as a contact pad of the module 300. The ANT port electrical connection to the top of the PIN diodes 302 and 308 is also not shown.

In the example of FIG. 9, both of the electrical insulator structures 314, 316 are shown to be coupled to a grounding pad 318. To facilitate thermal conduction between the PIN diodes 302, 308 and the grounding pad 318, the PIN diodes 302, 308 can be adhered to metal patterns 1000 and 1001 of their respective electrical insulator structures 314, 316 by, for example, thermally conductive epoxy. Such a thermally conductive epoxy may or may not be electrically conductive. Further, the electrical insulator structures 314, 316 can be adhered to the grounding pad 318 by, for example, thermally conductive epoxy. Such a thermally conductive epoxy may or may not be electrically conductive.

In the example of FIG. 9, an overmold 320 can be formed to encapsulate various components such as the PIN diodes 302, 308, the wirebonds 302, 310, and the electrical insulator structures 314, 318. Such an overmold can be configured to yield a desirable package form factor that allows easy handling and mounting onto a circuit board.

In the example module 300 of FIG. 10, a plurality of PIN diodes are shown to be mounted on a common electrical insulator substrate 315. For example, a first PIN diode 302 and a second PIN diode 308 are mounted on the metal patterns 1000 and 1001 of electrical insulator substrate 315. An electrode of the first PIN diode 302 is shown to be electrically connected to a first contact pad 306 through a wirebond 304 and an electrical path 322, and an electrode of the second PIN diode 308 is electrically connected to a second contact pad 312 through a wirebond 310 and an electrical path 324. The first contact pad 306 can be a TX port of, for example, the RF switch circuit 195 of FIG. 8, and the second contact pad 312 can be an RX port of the RF switch circuit 195. Although not shown in FIG. 10, an ANT port can be implemented as a contact pad of the module 300. In such a configuration, the first PIN diode 302 can be, for example, PIN diode 204 in FIG. 8, and the second PIN diode 308 can be PIN diode 204 of FIG. 8.

In the example of FIG. 10, the electrical insulator substrate 315 is shown to be coupled to a grounding pad 318. To facilitate thermal conduction between the PIN diodes 302, 308 and the grounding pad 318, the PIN diodes 302, 308 can be adhered to the metal patterns 1000 and 1001 of electrical insulator substrate 315 by, for example, thermally conductive epoxy. Such a thermally conductive epoxy may or may not be electrically conductive. Further, the electrical insulator substrate 315 can be adhered to the grounding pad 318 by, for example, thermally conductive epoxy. Such a thermally conductive epoxy may or may not be electrically conductive. In some embodiments the grounding pad 318 the contact pads 306, 312, and the metal patterns 1000 and 1001 can be formed on the surface of the electrical insulator substrate 315 utilizing one or more metallization techniques.

In the example of FIG. 10, an overmold 320 can be formed over the electrical insulator substrate 315 to encapsulate various components such as the PIN diodes 302, 308 and the wirebonds 302, 310. Such an overmold can be configured to yield a desirable package form factor that allows easy handling and mounting onto a circuit board.

In some embodiments, the electrical insulator structures 314, 316 and the electrical insulator substrate 315 of FIGS. 9 and 10 can be formed from aluminum nitride (AlN). Such a material can provide desired electrical insulation property, as well as desired thermal conductance property. It will be understood that other materials can also be utilized.

In some embodiments, the example modules 300 of FIGS. 9 and 10 can be implemented in, for example, a quad-flat no-leads (QFN) package format. A significant portion of the heat generated by the PIN diodes under high power RF signals can be conducted from the diode junctions to the grounding pad through the AlN substrate(s). When such a module is mounted on a circuit board, the heat can be further transferred from the grounding pad to a ground plane in the circuit board, and then to ambient surrounding via a heat sink.

Figure 11:
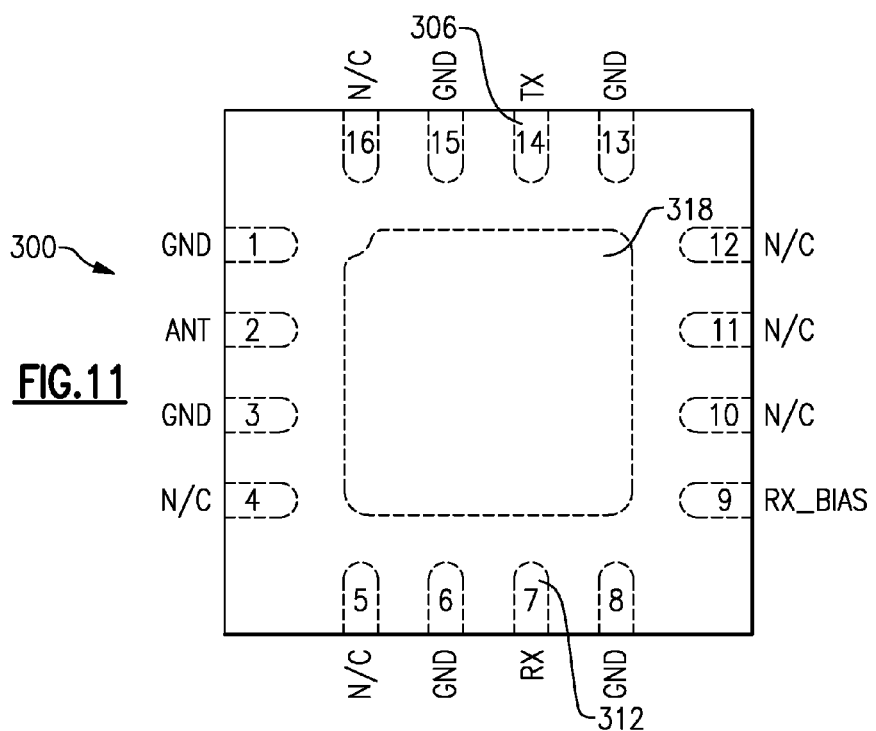
FIG. 11 shows an example pin layout that can be implemented for the examples of FIGS. 9 and 10 in an example QFN packaging format.

In the context of the example QFN packaging format, FIG. 11 shows an example pin layout that can be implemented for the examples of FIGS. 9 and 10. The grounding pad 318 can be implemented at or near the center of the lower surface of the module 300. Various connection pins, such as the TX pin 306 and the RX pin 312, can be implemented along the periphery of the lower surface of the module 300.

Figure 12:
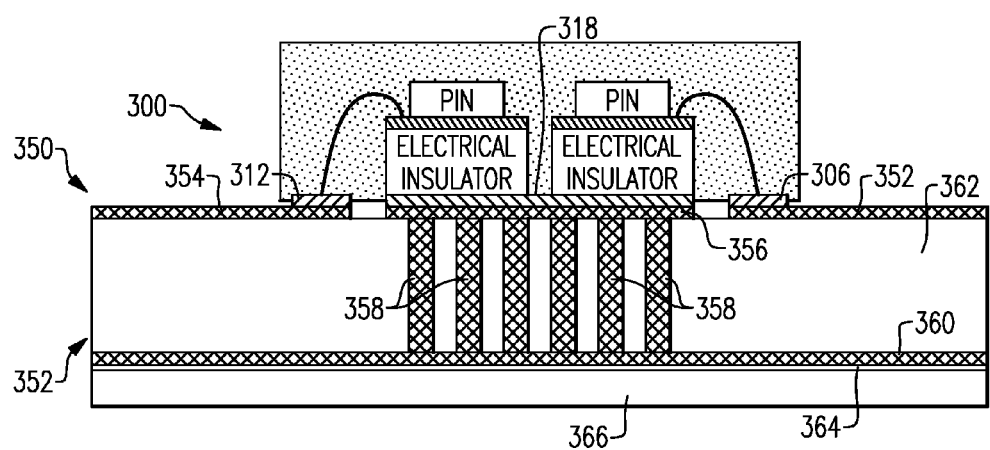
FIG. 12 shows an example configuration where a module is mounted on a printed circuit board (PCB).

FIG. 12 shows an example configuration 350 where a module 300 is mounted on a printed circuit board (PCB) 352. The module 300 can be either of the examples described in reference to FIGS. 9 and 10. The contact pads 306, 312 (e.g., TX and RX ports) of the module 300 are shown to be in contact with their respective contact features 352, 354. The grounding pad 318 of the module 300 is shown to be in contact with a corresponding grounding pad 356 on the PCB 352.

The grounding pad 356 is shown to be connected to a ground plane 360 through a plurality of conductive vias 358 formed through a substrate layer 362 of the PCB 352. Thus, heat arriving at the contact pad 318 of the module 300 can be transferred through the contact pad 356 of the PCB 352, through the vias 358, and to the ground plane 360.

In the example of FIG. 12, the ground plane 360 can be mounted to a chassis 366 through, for example, a solder mask layer 364. Accordingly, heat arriving at the ground plane 360 can be dissipated into the chassis 366.

Figure 13:
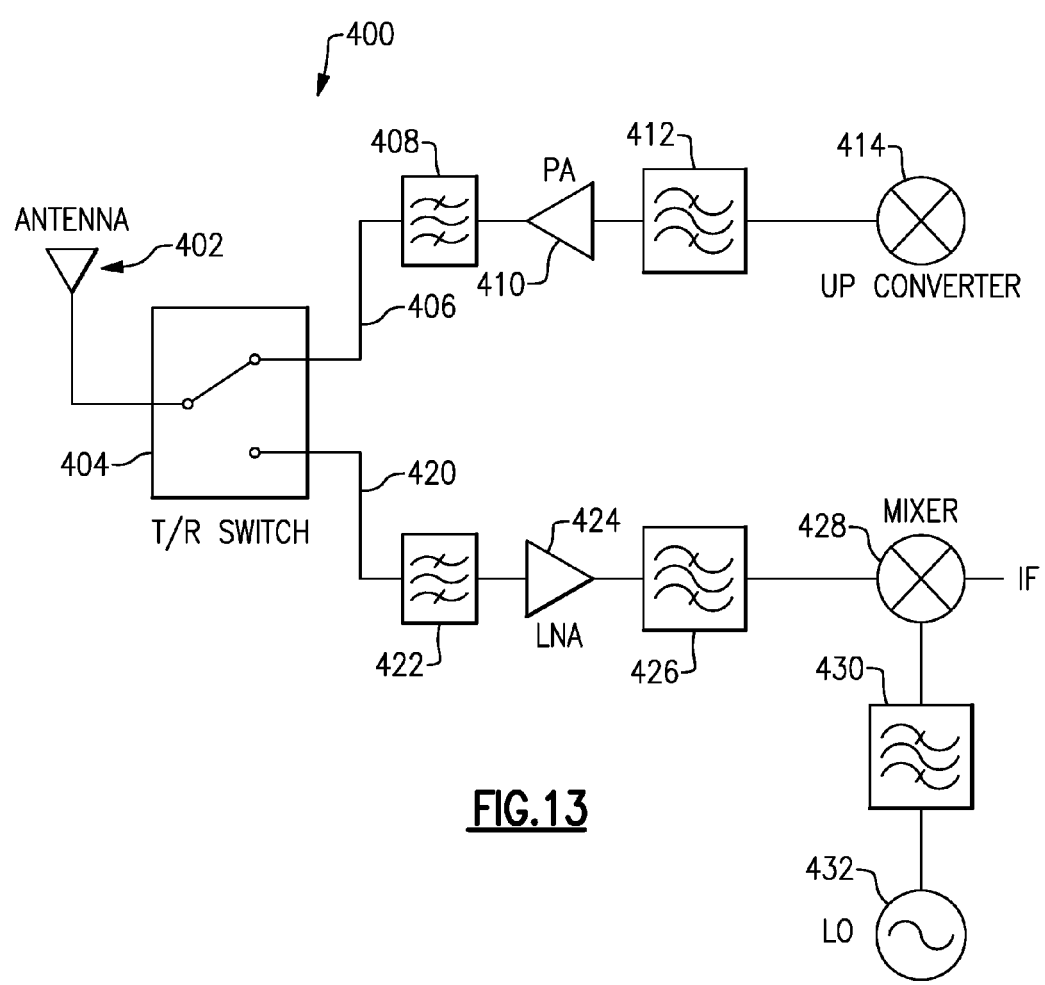
FIG. 13 shows that in some embodiments, a switching circuit or a switch module having one or more features as described herein can be implemented in an RF system.

FIG. 13 shows that in some embodiments, a switching circuit or a switch module having one or more features as described herein can be implemented in an RF system 400. In the example RF system 400, a transmit/receive (T/R) switch 404 can include one or more PIN diodes implemented as described herein. Such a T/R switch can allow use of a common antenna 402 for transmit and receive operations. Such transmit and receive operations can be facilitated by switching actions of the T/R switch 404.

As shown in FIG. 13, the RF system 400 can include a transmit circuit configured to generate, amplify, filter, and transmit an RF signal. Such an RF signal can be generated from a baseband subsystem (not shown) and an upconverter 414. The RF signal can then be filtered (e.g., by a band-pass filter 412) before being amplified by a power amplifier (PA) 410. The amplified RF signal can further be filtered (e.g., by a band-pass filter 408) and be provided to the T/R switch 404 through path 406 so as to be routed to the antenna 402.

As further shown in FIG. 13, a received signal from the antenna 402 can be routed to a receiver circuit by the T/R switch 404 to a low-noise amplifier (LNA) 424 (e.g., through path 420 and a band-pass filter 422). The output of the LNA 424 can be filtered further by a filter 426 (e.g., a band-pass filter), and the filtered signal can be converted to an intermediate frequency (IF) signal for further processing. Such a conversion can be facilitate by a mixer 428, a local oscillator (LO) 432, and a filter 430.

In some embodiments, the example RF system 400 can be implemented in a base station. In such an application, the amplified RF signal to be transmitted can have relatively high power, and the T/R switch 404 needs to be able to handle such power while maintaining desirable performance levels. One or more features as described herein can be implemented in such a T/R switch 404 to allow handling of high power while providing excellent RF performance.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch circuit comprising:
a first switchable path implemented between an antenna port and a first throw, the first switchable path including one or more PIN diodes;
a second switchable path implemented between the antenna port and a second throw, the second switchable path including one or more PIN diodes; and
a switchable shunt path implemented between the second throw and a ground, the switchable shunt path including at least one forward-biased shunt PIN diode and a capacitance, and a shunt bias port connected to a node between the capacitance and the at least one forward-biased shunt PIN diode.

2. The radio-frequency switch circuit of claim 1 wherein the first throw is a transmit port configured to receive an amplified radio-frequency signal.

3. The radio-frequency switch circuit of claim 2 further comprising an additional switchable shunt path implemented between the transmit port and a ground.

4. The radio-frequency switch circuit of claim 3 wherein the additional switchable shunt path includes at least one forward-biased shunt PIN diode.

5. The radio-frequency switch circuit of claim 1 further comprising a transmit bias port electrically connected to a node between the first throw and the one or more PIN diodes of the first switchable path.

6. The radio-frequency switch circuit of claim 1 wherein the second throw is a receive port configured to output a received signal.

7. The radio-frequency switch circuit of claim 1 further comprising a receive bias port electrically connected to a node between the second throw and the one or more PIN diodes of the second switchable path.

8. An antenna switch module comprising:
a grounding pad;
an electrical insulator layer implemented over the grounding pad; and
a switch circuit including a first switchable path implemented between an antenna port and a transmit port, the first switchable path including one or more PIN diodes implemented over the electrical insulator layer, the switch circuit further including a second switchable path implemented between the antenna port and a receive port, the second switchable path including one or more PIN diodes implemented over the electrical insulator layer, the switch circuit further including a switchable shunt path implemented between the receive port and a ground, the switchable shunt path including at least one forward-biased shunt PIN diode implemented over the electrical insulator layer and a capacitance, and a shunt bias port connected to a node between the capacitance and the at least one forward-biased shunt PIN diode implemented over the electrical insulator layer.

9. The antenna switch module of claim 8 wherein the electrical insulator layer is a thermal conductor thereby allowing conduction of heat between a PIN diode and the grounding pad.

10. The antenna switch module of claim 9 wherein the electrical insulator layer includes aluminum nitride (AlN).

11. The antenna switch module of claim 8 wherein each PIN diode is secured to the electrical insulator layer by a thermally conductive adhesive.

12. The antenna switch module of claim 8 wherein the electrical insulator layer is secured to the grounding pad by a thermally conductive adhesive.

13. The antenna switch module of claim 8 further comprising an overmold implemented over the electrical insulator layer, the overmold dimensioned to encapsulate at least the PIN diodes of the switch circuit.

14. The antenna switch module of claim 8 further comprising an additional switchable shunt path implemented between the transmit port and the ground.

15. A radio-frequency system comprising:
an antenna;
a transceiver in communication with the antenna; and
a transmit/receive switch implemented between the antenna and the transceiver, the transmit/receive switch including a grounding pad and an electrical insulator layer implemented over the grounding pad, the transmit/receive switch further including a switch circuit having a first switchable path implemented between an antenna port and a transmit port, the first switchable path including one or more PIN diodes implemented over the electrical insulator layer, the switch circuit further including a second switchable path implemented between the antenna port and a receive port, the second switchable path including one or more PIN diodes implemented over the electrical insulator layer, the switch circuit further including a switchable shunt path implemented between the receive port and a ground, the switchable shunt path including at least one forward-biased shunt PIN diode implemented over the electrical insulator layer and a capacitance, and a shunt bias port connected to a node between the capacitance and the at least one forward-biased shunt PIN diode implemented over the electrical insulator layer.

16. The radio-frequency system of claim 15 wherein the radio-frequency system is implemented as a base station.

17. The radio-frequency system of claim 16 wherein the first switchable path is configured to handle high power associated with amplified transmit signals associated with the base station.

18. The radio-frequency system of claim 16 wherein the second switchable path is associated with received signals associated with the base station.

* * * * *